(12) United States Patent
Becker

(10) Patent No.: US 6,233,509 B1
(45) Date of Patent: May 15, 2001

(54) ELECTRONIC DIAGNOSTIC SYSTEM

(75) Inventor: Michael Christopher Becker, Stockport (GB)

(73) Assignee: Genrad Limited (GB)

( * ) Notice: Subject to any disclaimer, the term of this patent is extended or adjusted under 35 U.S.C. 154(b) by 0 days.

(21) Appl. No.: 09/011,572

(22) PCT Filed: Jul. 8, 1996

(86) PCT No.: PCT/GB96/01621

§ 371 Date: Feb. 22, 1999

§ 102(e) Date: Feb. 22, 1999

(87) PCT Pub. No.: WO97/06514

PCT Pub. Date: Feb. 20, 1997

(30) Foreign Application Priority Data

Aug. 10, 1995 (GB) ................................... 9516414

(51) Int. Cl.$^7$ ................................. G06F 7/00; G06F 19/00
(52) U.S. Cl. ................................. 701/29; 701/31; 714/25; 714/30; 714/46
(58) Field of Search .................................. 701/29, 30, 31, 701/32, 33; 714/25, 29, 30, 46

(56) References Cited

U.S. PATENT DOCUMENTS 5,905,885 * 5/1999 Richter .................................. 395/500

FOREIGN PATENT DOCUMENTS

2217029A * 10/1989 (EP) .

* cited by examiner

Primary Examiner—William A Cuchlinski, Jr.
Assistant Examiner—Gertrude Arthur
(74) Attorney, Agent, or Firm—Piper Marbury Rudnick & Wolfe

(57) ABSTRACT

A vehicle diagnostic system suitable for coupling to a CAN bus. The system has a connector which is coupled directly to the CAN bus and an analyzer which is coupled to the connector by relatively long cables. A buffer is located in the connector to isolate the electrical load represented by the cable from the CAN bus and to communicate signals transmitted from the analyzer to the bus and received from the bus to the analyzer. Thus data can be read directly from the bus to conveniently located analysis equipment.

2 Claims, 2 Drawing Sheets

ELECTRONIC DIAGNOSTIC SYSTEM

BACKGROUND OF THE INVENTION

1. Field of the Invention

The present invention relates to a vehicle diagnostic system.

2. Description of the Related Art

Modern vehicles incorporate complex electronic and electromagnetic active components such as engine management systems, fuel delivery control systems, and brake control system. It is desirable that these active components intercommunicate and as a result it is now becoming conventional to equip vehicles with a serial data communication bus linking active vehicle components and in particular components known as Electronic Control Units (ECU's). There are several widely used serial communication protocols which are accepted as industry standards, one such high speed and high performance protocol being known as CAN (that is Controller Area Network). The term CAN bus is used herein to mean any bus linking active components of a vehicle and conveying data representative of the performance of those components.

It is conventional practice to communicate between diagnostic equipment and a vehicle over its diagnostic bus. However, a CAN bus is not primarily intended for diagnostics and is not designed to allow for the connection of additional cable lengths to the vehicle's wiring system. The addition of a length of cable to a vehicle's CAN bus may cause data corruption.

The active components transmit to and receive data from the CAN bus to which they are connected at a high data rate, for example 1 Mbps. Such a high data rate ensures that the large volume of data can be handled, but also means that propagation delays on the bus must be minimized. Propagation delays of more than 20 ns are not acceptable on a conventional CAN bus. Accordingly, each active element must be carefully designed to present no more than a predetermined electrical load to the bus.

In order to gain access to data on a CAN bus for diagnostic purposes, it is conventional practice to connect a gateway terminal to the bus. The gateway terminal is permanently connected to the bus and in effect represents an additional active component. The gateway terminal monitors data on the CAN bus, and records fault conditions or other diagnostic related parameters. This diagnostic data may later be downloaded to appropriate diagnostic equipment. The data available at the output of the gateway terminal is limited in scope as compared with that on the bus, the nature of the data being determined largely by regulatory demands, e.g. regulations imposed by particular political bodies. Typically a gateway terminal is designed to meet an agreed standard such as ISO9141. Unfortunately, although regulations may change over the life of a vehicle, it is not possible to readily modify a gateway terminal to reflect such changes. Furthermore, problems can arise in a vehicle which cannot be readily diagnosed using the signals output by a conventional gateway terminal, especially where the data rate on the vehicle side of the gateway is much higher than that on the output side of the gateway.

A CAN bus is generally in the form of a twisted pair cable linking the active components. It is sometimes desirable to connect diagnostic equipment to the cable to gain direct access to the data on the bus rather than relying upon a gateway terminal. Unfortunately, diagnostic equipment is generally located in cabinets and cannot readily be positioned close to a vehicle under test. It has been discovered by the applicants that it is not possible to connect a cable between a CAN bus and a remote diagnostic station as signal reflections arise which result in corruption of data on the bus. In a typical CAN system the maximum acceptable length of a stub connection to the bus is limited to 30 centimeters. This makes a direct connection between a CAN bus and many types of diagnostic equipment impractical.

BRIEF SUMMARY OF THE INVENTION

According to present invention, there is provided a vehicle diagnostic system comprising a connector which may be coupled to a CAN bus, and an analyzer incorporating test equipment linked to the connector by a cable, wherein the connector comprises a buffer located between the bus and the cable to isolate the electrical load represented by the cable from the bus and to communicate signals transmitted from the analyzer to the bus and received from the bus to the analyzer.

Preferably the buffer comprises a converter circuit arranged to interface bi-directional signals on the buffer with unidirectional transmit and receive signals. The buffer and analyzer each comprise a line driver and receiver circuit arranged to convert signals from the buffer converter and test equipment to a protocol suitable for transmission on a cable, and to convert signals from the cable to signal suitable for applications to the buffer converter and test equipment.

The test equipment used can be of conventional form, as can the buffer converter circuit, the novelty lying in the separation of these two components such that one of the components is in the connector at one end of the cable and the other component is in the analyzer at the other end of the cable. The line driver and receiver circuit ensure that data is not corrupted during its transmission through the cable. The signals from the test equipment and the buffer converter may be converted to RS422 levels for transmission along the cable.

BRIEF DESCRIPTION OF THE SEVERAL VIEWS OF THE DRAWINGS

An embodiment of the present invention will now be described, by way of example, with reference to the accompanying drawings, in which.

DETAILED DESCRIPTION OF THE INVENTION

Figure 1:
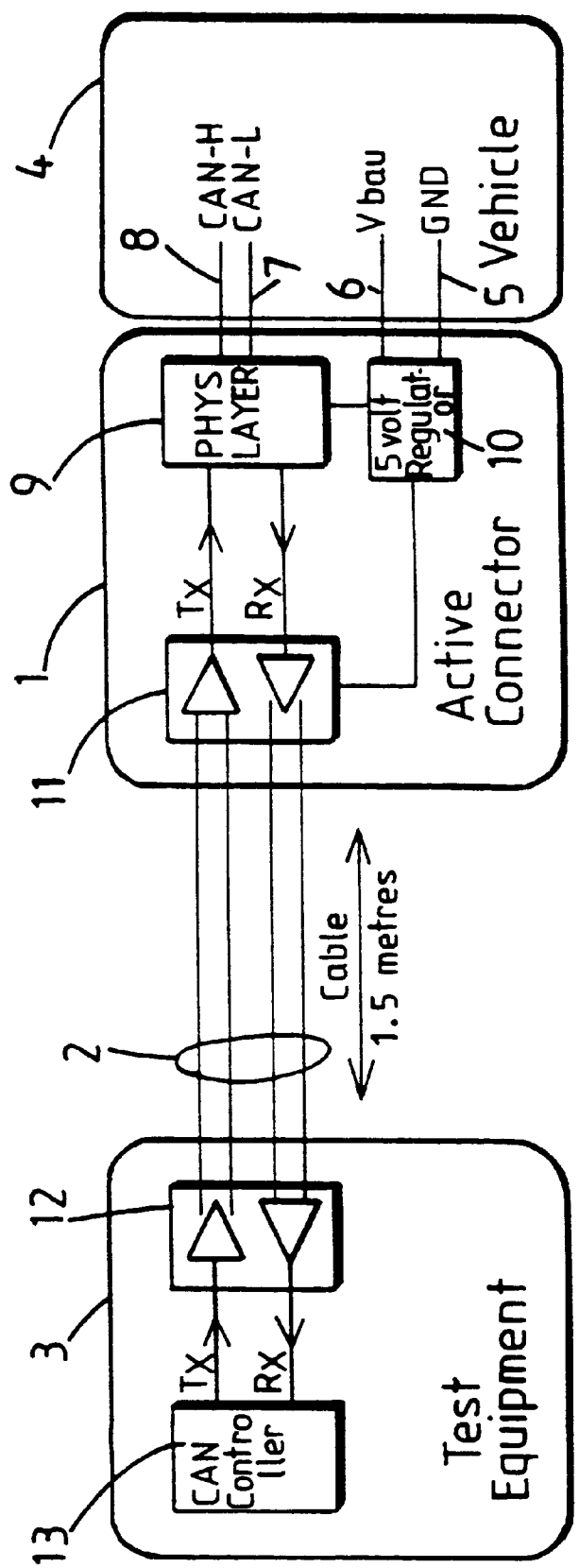
FIG. 1 is a schematic illustration of an embodiment of the present invention.

Referring to FIG. 1, a connector 1 is coupled by a four conductor cable to an analyzer 3. The connector is linked to a vehicle 4 by four conductors, conductor 5 being connected to the vehicle ground, conductor 6 being connected to the vehicle battery, conductor 7 being connected to the "low" cable of a CAN bus, and conductor 8 being connected to the "high" conductor of a CAN bus. As is conventional, the voltage levels on the CAN bus will be analogue, typically 2.5 volts when passive and 3.5 volts on the "high" wire and 1.5 volts on the "low" wire when dominant.

The connector 1 in effect comprises a buffer to isolate the CAN bus from the electrical load represented by the cable 2. A circuit 9 powered by a simple voltage regulator 10 converts the bi-directional signals on the CAN bus into transmit (TX) and receive (RX) unidirectional digital signals. These digital signals are then buffered by conversion to RS422 levels by a differential line driver/receiver circuit 11 which is also powered by the voltage regulator 10.

The analyzer comprises a differential line driver and receiver circuit 12 which is identical to the circuit 11. Transmit and receive signals are passed between the circuit 12 and a conventional CAN controller. Any suitable test equipment could however be connected to the transmit and receive lines of the circuit 12.

It will be appreciated that data derived from the CAN bus by the circuits in the connector 1 can be transmitted considerable different distances over the cable to any conveniently located test equipment. Thus data relevant to the operation of the vehicle can be derived without it being necessary to move the test equipment to close proximity with the CAN bus itself.

Figure 2:
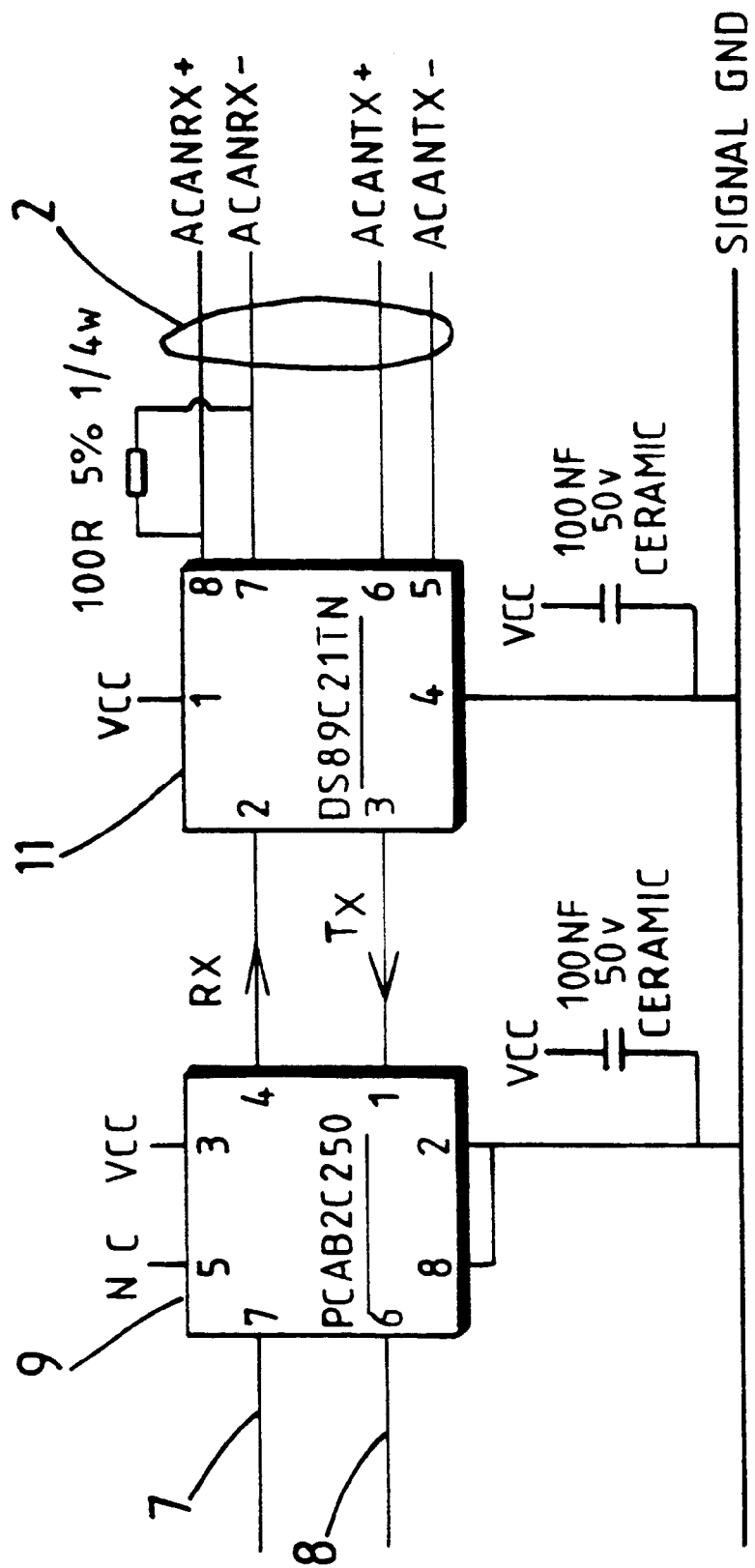
FIG. 2 illustrates the components provided in the connector of FIG. 1.

Referring to FIG. 2, the same reference numerals are used as were used with reference to FIG. 1. The conductors 7 and 8 are connected to a PCA82C250 chip corresponding to the circuit 9 of FIG. 1 and that chip is connected to a DS89C21TN chip corresponding to the line driver and receiver circuit 11 of FIG. 1. The four wires 2 connected to the circuit 11 correspond to cable 2 of FIG. 1. The chips referred to are readily available components and familiar to engineers with knowledge of CAN bus systems.

What is claimed is:

1. A vehicle diagnostic system for a vehicle equipped with a CAN bus, the vehicle diagnostic system comprising:
    a connector adapted to be coupled to the CAN bus;
    an analyzer incorporating test equipment linked to the connector by a cable;
    said connector including a buffer located between the bus and the cable to isolate an electrical load represented by the cable from the bus and to communicate signals transmitted from the analyzer to the bus and received from the bus to the analyzer.

2. A system according to claim 1, wherein the buffer comprises a converter circuit arranged to interface bi-directional signals on the bus with unidirectional transmit and receive signals, and the buffer and analyser each comprise a line driver and receiver circuit arranged to convert signals from the buffer converter and test equipment to a protocol suitable for transmission on the cable, and to convert signals from the cable to signals suitable for application to the buffer converter and test equipment.

* * * * *